United States Patent [19]
Ishimaru

[11] Patent Number: 5,389,197
[45] Date of Patent: Feb. 14, 1995

[54] METHOD OF AND APPARATUS FOR PLASMA PROCESSING OF WAFER

[75] Inventor: Yasushi Ishimaru, Kawasaki, Japan

[73] Assignee: Fujitsu Limited, Kawasaki, Japan

[21] Appl. No.: 10,366

[22] Filed: Jan. 28, 1993

[30] Foreign Application Priority Data

Jan. 29, 1992 [JP] Japan .................. 4-013674

[51] Int. Cl.6 .......................................... H01L 21/00
[52] U.S. Cl. .................... 156/643; 156/345; 118/119; 118/728; 118/723 MR; 427/569
[58] Field of Search ............. 156/345, 643; 118/723 ER, 723 IR, 723 MR, 119, 728, 732; 427/569

[56] References Cited

U.S. PATENT DOCUMENTS

| | | | |
|---|---|---|---|
| 4,836,902 | 6/1989 | Kalnitsky et al. | 156/345 |
| 5,114,529 | 5/1992 | Masuyama et al. | 156/643 |
| 5,181,986 | 1/1993 | Ohiwa | 156/345 |
| 5,217,559 | 6/1993 | Moslehi et al. | 156/345 |
| 5,302,226 | 4/1994 | Yamazaki et al. | 156/345 |

FOREIGN PATENT DOCUMENTS

| | | |
|---|---|---|
| 56-23745 | 3/1981 | Japan . |
| 61-088528 | 5/1986 | Japan . |
| 02072620 | 3/1990 | Japan . |
| 02156088 | 6/1990 | Japan . |
| 03061377 | 3/1991 | Japan . |

OTHER PUBLICATIONS

T. Tsuchiya et al., "Two Step Tapered Via Hole Etching Using Down Flow and Reactive Ion Etching," *Proceedings of the Symposia on Reliability of Semiconductor Devices and Interconnection and Multilevel Metallization, Interconnection, and Contact Technologies*, vol. 89-6, May 7, 1989, pp. 425-435.

Primary Examiner—R. Bruce Breneman
Assistant Examiner—George Goudreau
Attorney, Agent, or Firm—Staas & Halsey

[57] ABSTRACT

A method of down-flow type plasma processing, such as etching or ashing, on a wafer, in which a plasma of a reactant gas is formed by subjecting a reactant gas to a high frequency electromagnetic wave and only active species generated by the plasma is supplied onto the wafer while the plasma is shielded from the wafer, the method comprising the steps of mounting a wafer on a flat surface of a wafer stage; disposing an exhaust ring having a diameter greater than that of the wafer concentrically with the wafer; and exhausting through the entire exhaust gap formed between the flat surface of the wafer stage and one end of the exhaust ring. An apparatus for carrying out the method is also disclosed.

9 Claims, 5 Drawing Sheets

METHOD OF AND APPARATUS FOR PLASMA PROCESSING OF WAFER

BACKGROUND OF THE INVENTION

1. Field of the Invention

The present invention relates to a method of and an apparatus for a charge-free radical or down-flow type plasma processing, such as plasma etching and plasma ashing, in which a reactant source gas is activated by a high frequency electromagnetic wave, such as microwaves and radio frequency waves, to form a plasma and thereby to generate chemically active species or radicals which react with a wafer, such as a silicon wafer, to perform "etching" or "ashing" of the wafer, while the plasma itself is shielded from the wafer by a shielding plate.

2. Description of the Related Art

One of the important aspects of plasma processing, such as etching or ashing of a silicon wafer or the like is the distribution of the rate of processing over the wafer surface. As the wafer size increases, a uniform distribution of the processing rate must be maintained over a larger area of the wafer. To this end, the pressure and flow of the source gas must be precisely controlled in the vicinity of the wafer surface such that the active species spreads uniformly over the wafer surface.

FIG. 1 schematically illustrates an arrangement of a conventional plasma processing apparatus, such as plasma etcher or asher, as disclosed in T. Tsuchiya et al., "Proceedings of the Symposia on Reliability of Semiconductor Devices and Interconnection and Multilevel Metallization, Interconnection, and Contact Technologies", Vol. 89-6 (May 7, 1989), pp.425-435. The plasm etcher as disclosed therein comprising a reactant gas supply pipe 51, a plasma generating chamber 52, a microwave transmitting window 53 of quartz or ceramics, a waveguide 54, a plasma outlet 55, a plasma shielding plate 56, a processing (etching or ashing) chamber 57, a wafer stage 58, a wafer 59, and an exhaust port 60.

In the conventional arrangement as shown in FIG. 1, plasma processing such as etching or ashing of the wafer 59 is performed by mounting the wafer 59, such as a silicon wafer on the wafer, stage 58, supplying a reactant source gas (such as a mixed $CF_4+O_2$ gas or other etching gas when performing etching) through the reactant gas supply pipe 51 to the plasma generating chamber 52, and 10 activating there the reactant gas by a microwave from a microwave generator (not shown), guided along the waveguide 54 and introduced through the microwave transmitting window 53, to form a plasma in the plasma generating chamber 52, the plasma being allowed to flow into the etching or ashing chamber 57 through the plasma outlet 55.

While passing through a gap, along the backside of the shielding plate 56, the plasma flowing from the plasma generating chamber 52 is neutralized to form an active species or radical, which reacts with the wafer 59 mounted on the wafer stage 58, thereby etching or ashing the wafer surface. Thereafter, the gas is exhausted through the exhaust port 60.

In the conventional arrangement as shown in FIG. 1, the level of the wafer stage 58 is adjusted by trial and error to provide an optimum distribution of the processing rate (i.e. etching or ashing rate) over the wafer surface.

An optimum distribution of the processing rate over the wafer surface is obtained by actually processing the wafer surface at different levels of the wafer stage.

The adjustment of the wafer stage level alone, however, does not provide a uniform bombardment of the active species against the wafer surface, but only provides a limited processing rate distribution over the wafer surface of about 3-5% at best.

Therefore, a reduced yield in the production of semiconductor devices is observed when using such a wafer.

SUMMARY OF THE INVENTION

The object of the present invention is to provide a method and an apparatus for charge-free radical or down-flow type plasma processing, such as plasma etching and plasma ashing, having an improved processing rate distribution or uniformity.

To achieve the object according to the present invention, down-flow type plasma processing, such as etching or ashing, on a wafer is used, in which a plasma of a reactant gas is formed by subjecting a reactant gas to a high frequency electromagnetic wave and supplying only the active species generated by the plasma onto the wafer while the plasma is shielded from the wafer. An improved processing rate distribution and uniformity is achieved by mounting a wafer on a flat surface of a wafer stage; disposing an exhaust ring having a diameter greater than that of the wafer concentrically with the wafer; and exhausting the spent gas through the exhaust gap formed between the flat surface of the wafer stage and one end of the exhaust ring.

According to another aspect of the present invention, the down-flow type plasma processing, such as etching or ashing, on a wafer, is performed on an apparatus that includes a first chamber for generating a plasma, the first chamber having a reactant gas supply port, a gastight window transmitting a high frequency electromagnetic wave, and a plasma outlet port. A second chamber is provided for processing a wafer, the second chamber having a cylindrical shape defined by a first base having a central plasma inlet port, a second base defined by a flat wafer stage having a diameter greater than that of the wafer to be processed, and a cylindrical side wall having one end hermetically connected with the first base and the other end spaced from the second base to form a ring-shaped exhaust gap, the plasma inlet port communicating with the plasma outlet port of the first chamber and facing a plasma shielding disk having a diameter sufficient for shielding the plasma from a wafer mounted on the wafer stage. The plasma shielding disk is disposed close to, generally parallel and concentrically with the first base to form a disk-shaped thin space in which the plasma from the first chamber is neutralized to generate an active species or radical which flows over the circumference of the plasma shielding disk into the processing space of the second chamber. A third chamber having an evacuation port is provided for gas exhaustion from said second chamber, the third chamber surrounding the circumference of the second chamber, is connected with the second chamber through the ring-shaped exhaust gap.

In use, a wafer is mounted on the flat wafer stage.

Thereafter the first, second and third chambers are maintained under vacuum by evacuating through the evacuation port of the third chamber.

A reactant gas is supplied to the first chamber through the reactant gas supply port where it is subjected to high frequency electromagnetic waves, thereby generating a plasma.

The plasma is moved from the first chamber to the disk-shaped thin space of the second chamber through the plasma outlet port while shielding the plasma from the wafer by the plasma shielding disk. This allows only active species generated by the plasma to enter the effective processing space of the second chamber. The ring-shaped exhaust gap is controlled so as to establish a gas stagnation in the effective processing space of the second chamber.

Finally, the gas is exhausted from the second chamber to the third chamber through the entire ring-shaped exhaust gap.

According to an alternative embodiment of the present invention, an apparatus for down-flow type plasma processing, such as etching or ashing, on a wafer, includes:

A plasma generating chamber having a reactant gas supply port, in which a reactant gas supplied through the supply port is subjected to a high frequency electromagnetic wave to form a plasma;

A shielding plate is provided for shielding the plasma from the wafer while allowing only the active species to flow toward the wafer held on a flat water stage.

A wafer stage having a flat surface; and

An exhaust ring having a diameter greater than that of the wafer and disposed concentrically with the wafer, so that exhaust is conducted through the entire exhaust gap formed between one end of the exhaust ring and the flat surface of the wafer stage.

According to a further embodiment of the present invention, there is provided an apparatus for down-flow type plasma processing, such as etching or ashing, on a wafer, having:

A first chamber for generating a plasma, the first chamber having a reactant gas supply port, a gastight window transmitting a high frequency. A electromagnetic wave, and a plasma outlet port, second chamber, for processing a wafer, has a cylindrical shape, defined by a first base having a central plasma inlet port, a second base, defined by a flat wafer stage having a diameter greater than that of the wafer to be processed, and a cylindrical side wall having one end hermetically connected with the first base and the other end spaced from the second base to form a ring-shaped exhaust gap. The plasma inlet port is connected with the plasma outlet port of the first chamber and faces a plasma shielding disk having a diameter sufficient for shielding the plasma from a wafer mounted on the wafer stage. The plasma shielding disk is disposed close to, generally parallel and concentrically with the first base to form a disk-shaped thin space in which the plasma from the first chamber is neutralized to generate an active species or radical which flows over the circumference of the plasma shielding disk into an effective processing space of the second chamber. A third chamber surrounding the second chamber is provided for gas exhaustion from said second chamber, through the ring-shaped exhaust gap.

The ring-shaped exhaust gap is controllable so as to establish a gas stagnation during the processing in the effective processing space of the second chamber.

Exhaustion from the second chamber to the third chamber being conducted through the entire ring-shaped exhaust gap of the second chamber.

The distribution of the processing rate over the wafer surface can be controlled by adjusting the ring-shaped exhaust gap.

In the present invention, "processing on a wafer" includes "etching" and "ashing". The term "etching" indicated etching of the wafer surface or etching of a layer, such as an oxide ($SiO_2$) layer, formed on the wafer surface. The term "ashing" means ashing of a resist layer formed on the wafer surface.

DESCRIPTION OF THE PREFERRED EMBODIMENTS

The present invention may be applied to both etching and ashing of a wafer, namely, the reactant gas may be an etching gas or an ashing gas. The etching gas used in the present invention may be, for example, a $CF_4 + O_2$ gas mixture for etching a silicate glass on a wafer. The ashing gas used in the present invention may be, for example $O_2$ gas.

The present inventors have found that the distribution of the processing rate over the wafer surface is improved when a gas stagnation is established in the processing chamber by mounting a wafer to be processed on a flat surface of a wafer stage having a diameter greater than that of the wafer, disposing an exhaust ring having a diameter greater than that the wafer concentrically with the wafer. Thereafter the exhaust gap is adjusted between one end of the exhaust ring and the flat surface of the wafer stage so that the gas pressures $Pp$ in the plasma generating chamber, $Pr$ inside the exhaust ring, and $Po$ outside the exhaust ring, have a relationship of $Pp > Pr > Po$.

Figure 1:
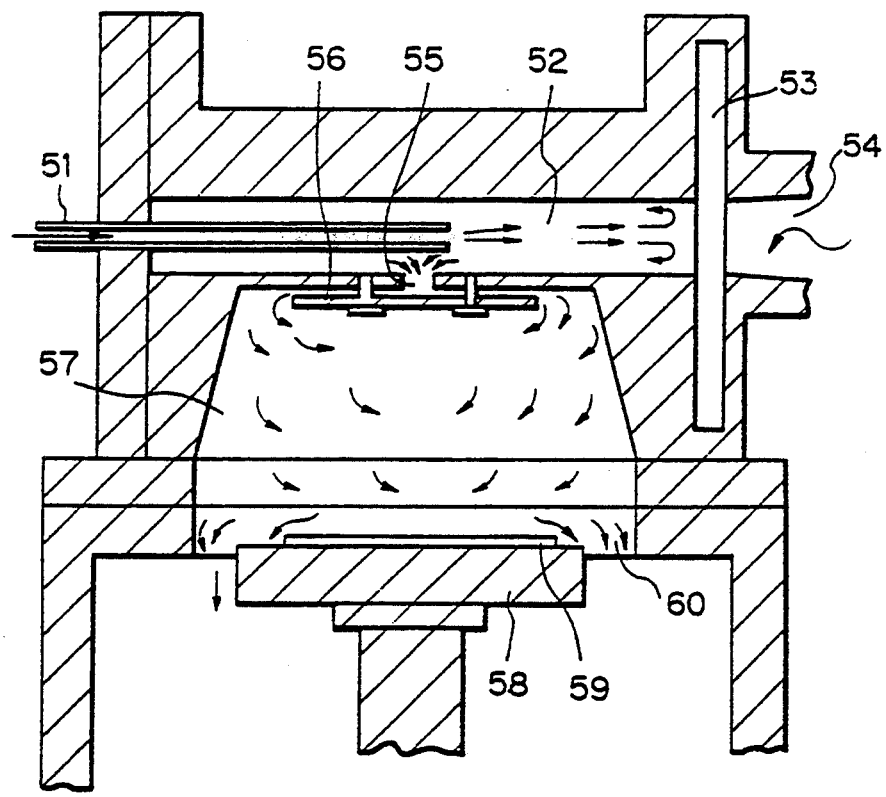
FIG. 1 shows a conventional arrangement for plasma processing of a wafer.
Figure 2:
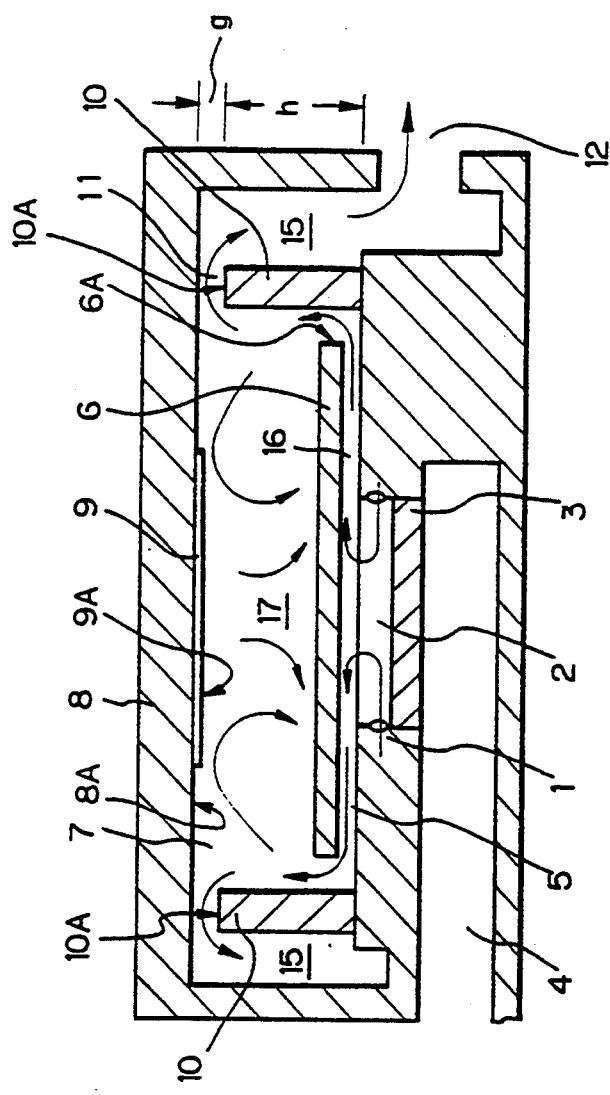
FIG. 2 shows an arrangement for plasma processing of a wafer, according to the present invention.

FIG. 2 schematically illustrates an apparatus for carrying out the process according to the present invention. Such apparatus includes a reactant gas supply port 1, a plasma generating chamber 2, a gastight window 3 for transmitting a high frequency electromagnetic wave, a waveguide 4, a plasma outlet 5, a plasma shielding plate 6 in the form of a disk, a wafer processing chamber 7 having a cylindrical shape, a wafer stage 8 having a flat surface 8A for mounting a wafer to be processed, a wafer 9 to be processed, a cylindrical side wall member 10, a ring-shaped exhaust gap 11 defined by the flat surface 8A and one end 10A of the exhaust ring 10, and an exhaust chamber 15 having an evacuation port 12 and surrounding the processing chamber 7.

In the apparatus shown in FIG. 2, the wafer 9 to be processed is mounted on the flat wafer stage 8 in such a manner that the only the wafer 9 protrudes from the flat wafer stage 8. A reactant gas (or an etching gas such as a $CF_4 + O_2$ mixture or an ashing gas such as $O_2$) is supplied to the plasma generating chamber 2 through the reactant gas supply port 1. The supplied reactant gas is subjected to a high frequency electromagnetic wave such as microwaves or radio frequency wave guided by the waveguide 4 and introduced to the plasma generating chamber 2 through the electromagnetic wave transmitting window 3. The reactant gas is thereby activated to form a plasma, which is introduced into the processing chamber 7 through the plasma outlet 5.

The plasma is passed through the disk-shaped thin space 16 defined by the plasma shielding plate 6 and is thereby neutralized to form an active species or radical. The radical flows over the circumference 6A of the plasma shielding plate 6 into the effective processing space 17 of the processing chamber 7 and processes (or etches or ashes) the surface 9A of the wafer 9.

After processing the wafer surface 9A, the active species (radical) or spent gas is exhausted through the ring-shaped exhaust gap 11 defined by the end 10A and the flat surface 8A to the exhaust chamber 15 and is then exhausted through the evacuation port 12.

The present inventors conducted an etching experiment in which the height, g, of the ring-shaped exhaust gap 11 was varied by using exhaust rings 10 having different heights, h. This varies the gas conductance for the exhaust from the etching chamber 7 through the evacuation port 12 while ensuring the relationship of $Pp > Pr > Po$ among the pressures Pp, Pr and Po in the plasma generating chamber 2, inside the exhaust ring 10 and outside the exhaust ring 10, respectively. After the etching was completed, the distribution of the etching rate over the wafer surface 9A was measured.

Figure 3:
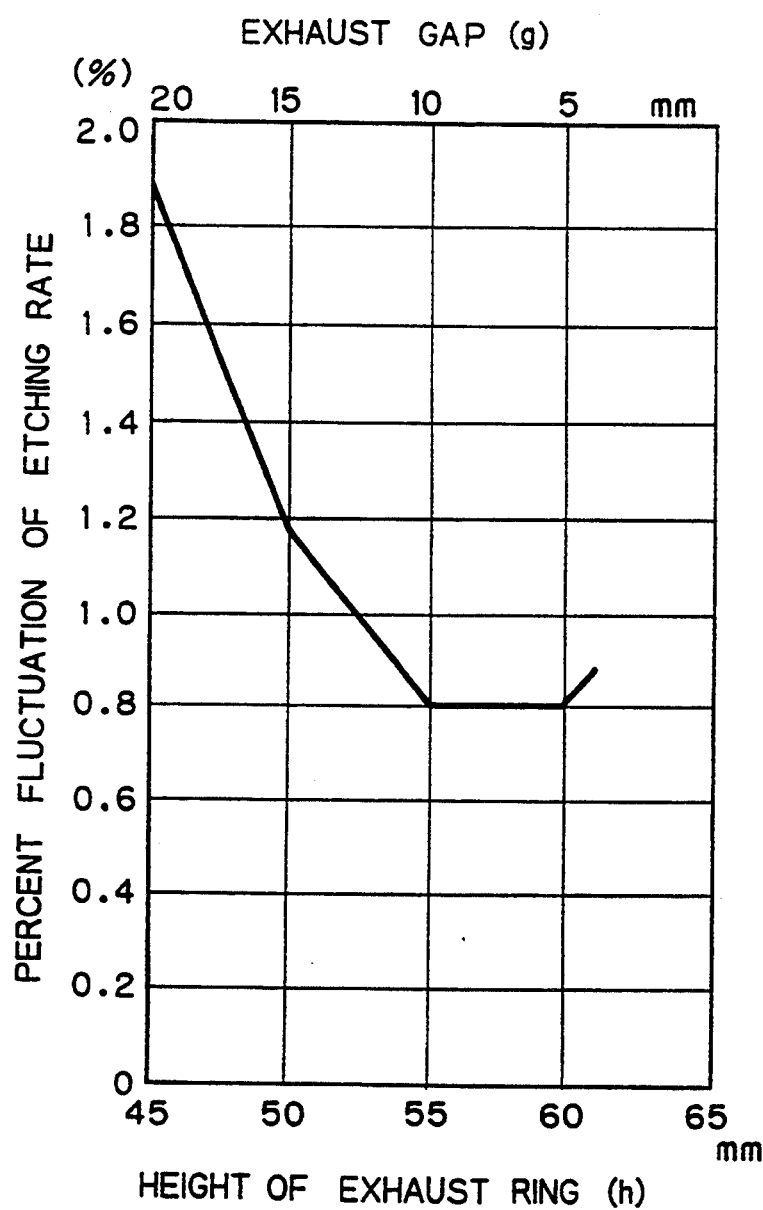
FIG. 3 is a graph showing the percent fluctuation in the etching rate over the wafer surface ($SiO_2$) as a function of the exhaust ring height or the exhaust gap height.

FIG. 3 shows the thus-obtained percent fluctuation of the etching rate over the wafer surface, in which the axis of abscissa indicates the height, h, of the exhaust ring 10 or the height, g, of the exhaust gap 11 and the axis of ordinate indicates the percent fluctuation of the etching rate distribution over the surface obtained for a wafer entirely coated with a thermal oxidation film.

As can be seen from FIG. 3, the etching rate distribution over the wafer surface can be controlled to provide an improved minimum fluctuation of 0.8% when the height, g, of the exhaust gap 11 was 5 to 10 mm by adjusting the ring height, h, or the gap height, g, while ensuring the relationship of $Pp > Pr > Po$ between the pressures Pp, Pr and Po so that the amount of active species supplied to the etching chamber 7 is somewhat greater than that exhausted from the etching chamber 7. This establishes a gas stagnation in the etching chamber 7 or a vortex of active species in the space near the wafer surface.

The condition of the stagnation varies depending on the exhaust gap and the capacity of the processing chamber. As the processing chamber capacity varies with the size of a wafer to be processed, an optimum exhaust gap required for providing a desired stagnation, also varies with the wafer size.

The above-obtained optimum gap of from 5 to 10 mm may be used for wafer sizes up to about 16 in.

EXAMPLE

Figure 4:
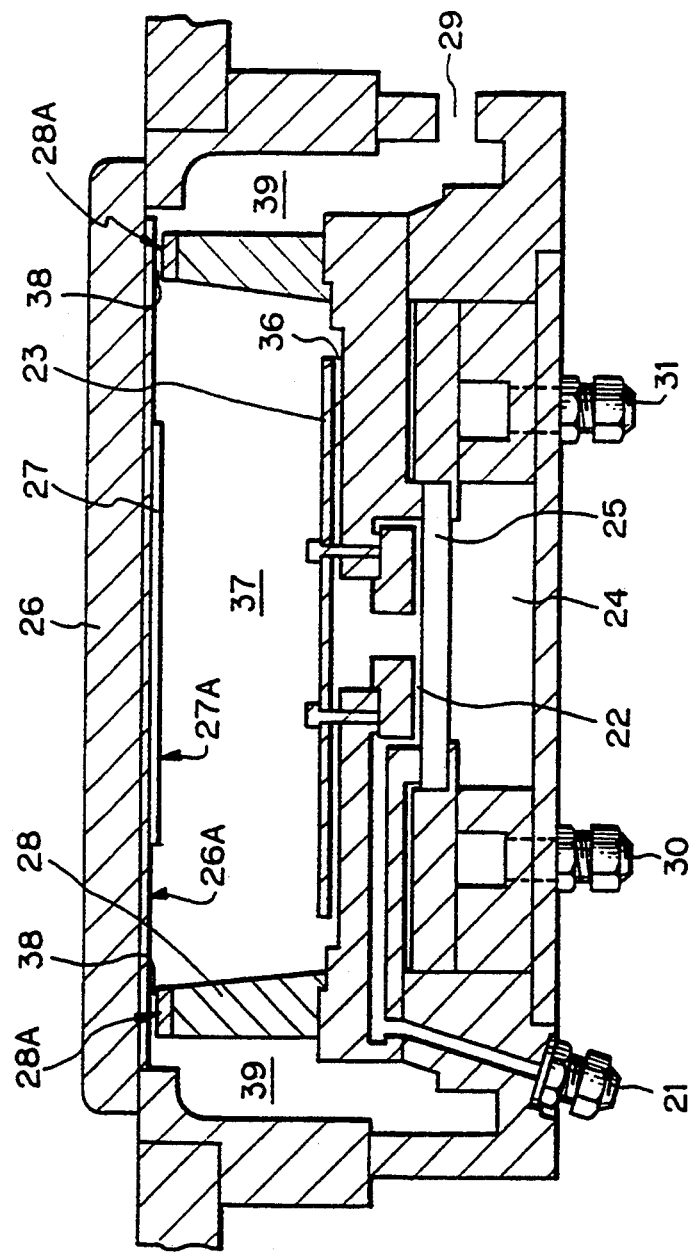
FIG. 4 shows another arrangement for plasma processing of a wafer, according to the present invention.

FIG. 4 shows an apparatus for carrying out the plasma etching of a wafer, according to the present invention. The shown apparatus has an etching gas supply port 21, a plasma generating chamber 22, a plasma shielding plate 23 in the form of a disk, a waveguide 24, a μ-wave transmitting window 25 of ceramics, a wafer stage 26 having a flat surface 26A, a wafer 27 to be etched, an exhaust ring 28, an evacuation port 29, and coolant circulating pipes 30 and 31.

As shown FIG. 4, a processing or etching gas such as a $CF_4 + O_2$ mixture is introduced through the etching gas supply port 21 to the plasma generating chamber 22. Therein the gas is subjected to a microwave (2.45 GHz) guided in the waveguide 24 and introduced in the plasma generating chamber 22 to form a plasma. The plasma passes through the disk-shaped thin space 36 and is thereby neutralized to generate an active species or radical. The active species or radical is allowed to reach a surface 27A of the wafer 27, electrostatically held on the flat surface 26A of the wafer stage 26, in the etching chamber 37 and etches an oxide film coated on the wafer surface 27A.

After etching the wafer surface 27A, the gas containing the active species or a spent gas is exhausted from the etching chamber 37 to the surrounding exhaust chamber 39, through the entire of the ring-shaped exhaust gap 38 defined by one end 28A of the exhaust ring 28 and the flat surface 26A of the wafer stage 26, and is then exhausted through the evacuation port 29 of the exhaust chamber 39.

A coolant circulates through the pipes 30 and 31 to cool the microwave transmitting window 25.

The apparatus of FIG. 4 has the following dimensions:

- exhaust gap (g); 5 mm,
- inner diameter of exhaust ring; 250 mm,
- height of exhaust ring; 60 mm,
- height of plasma generating chamber; 1 mm,
- diameter of plasma shielding plate; 200 mm, and
- height of disk-shaped thin space (defined by plasma shielding plate); 3 mm.

Figure 5:
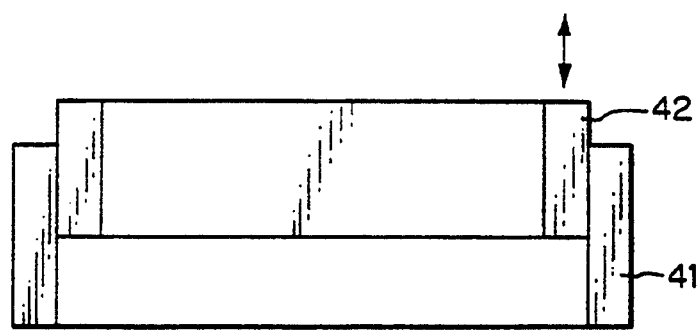
FIGS. 5A and 5B show modified arrangements for fine adjustment of the exhaust gap height.
Figure 5:
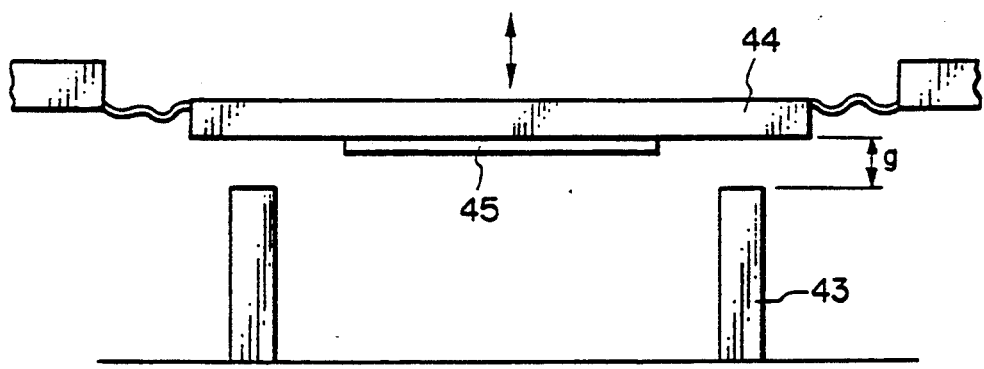

FIGS. 5A and 5B show a modified exhaust ring and a modified wafer stage according to alternative embodiments of the present invention.

The exhaust ring of FIG. 5A is composed of a stationary outer ring 41 and a movable inner ring 42 engaged in the outer ring 41. The height of the exhaust ring is adjusted by moving the inner ring 42 in the direction of the ring axis as shown by an arrow.

The wafer stage 44 as shown in FIG. 5B, is capable of fine adjustment to the level thereof, to provide a fine control of the exhaust gap (g) between the stage 44 and an exhaust ring 43.

The arrangements of FIGS. 5A and 5B are advantageous to provide an optimum exhaust gap for ensuring a uniform processing rate distribution over the wafer surface.

As hereinabove described, the present invention provides a method of and an apparatus for down-flow type plasma processing, such as etching or ashing, of a wafer, which effectively improve the processing rate distribution over the wafer surface, and thereby, greatly contributes to the improvement of the performance and the product yield of semiconductor devices.

I claim:

1. A method of down-flow type plasma processing on a wafer, in which a plasma of a reactant gas is formed by subjecting a reactant gas to a high frequency electromagnetic wave and supplying only the neutral active species, generated by neutralizing the plasma, onto the wafer while the plasma is shielded from the wafer, said method comprising the steps of:
   providing a wafer stage having a flat surface;
   mounting a wafer on the flat surface of the wafer stage;
   providing an exhaust ring having a diameter greater than that of the wafer;

disposing the exhaust ring concentrically around and spaced from the wafer stage thereby defining an exhaust gap between the wafer stage and the exhaust ring; and exhausting the neutral active species through the entirety of the exhaust gap.

2. A method according to claim 1, wherein the distribution of the processing rate over the wafer surface is controlled by adjusting the width of said exhaust gap.

3. A method according to claim 1, wherein said reactant gas is an etching gas.

4. A method according to claim 3, wherein said etching gas is a $CF_4+O_2$ gas mixture.

5. A method according to claim 1, wherein said reactant gas is an ashing gas.

6. A method according to claim 5, wherein said ashing gas is $O_2$ gas.

7. A method according to claim 1, wherein said wafer has a diameter of not more than 16 in.

8. A method according to claim 3, wherein said exhaust gap is in the range of from 5 to 10 mm.

9. A method of down-flow type plasma processing on a wafer using an apparatus including a first chamber for generating a plasma, said first chamber having a reactant gas supply port, a gastight window adapted for transmitting a high frequency electromagnetic wave, and a plasma outlet port; a second chamber for processing the wafer, said second chamber having a cylindrical shape defined by a first base having a central plasma inlet port communicating with said plasma outlet port of said first chamber, a flat wafer stage having a diameter greater than that of the wafer to be processed, and a cylindrical side wall having one end hermetically connected with the first base and the other end spaced from the flat wafer stage thereby defining a ring-shaped exhaust gap, a plasma shielding disk facing the plasma inlet port, the plasma shielding disk shielding the plasma from a wafer mounted on the wafer stage, the plasma shielding disk being generally parallel to and concentric with the first base thereby defining with the flat wafer stage an effective processing space within said second chamber, the plasma shielding disk further defining a disk-shaped thin space within the second chamber adapted to neutralize the plasma from the first chamber and thereby to generate neutral active species which flows over the circumference of the plasma shielding disk into the effective processing space of the second chamber; and a third chamber surrounding the circumference of the second chamber, the third chamber communicating with the second chamber through said ring-shaped exhaust gap, the third chamber having an evacuation port, said method comprising the steps of:

mounting a wafer on the flat wafer stage;

maintaining the first, second and third chambers under vacuum by evacuating through the evacuation port of the third chamber;

supplying a reactant gas to the first chamber through the reactant gas supply port;

introducing a high frequency electromagnetic wave into the first chamber through the window thereby generating a plasma;

introducing the plasma to the disk-shaped thin space of the second chamber through said plasma outlet port;

neutralizing said plasma and allowing only the neutral active species generated by neutralizing the plasma to enter the effective processing space of the second chamber;

exhausting the neutral active species from the second chamber to the third chamber through the ring-shaped exhaust gap; and controlling the width of the ring-shaped exhaust gap so as to produce stagnation of the neutral active species in the effective processing space of the second chamber.

* * * * *

UNITED STATES PATENT AND TRADEMARK OFFICE
CERTIFICATE OF CORRECTION

PATENT NO. : 5,389,197　　　　　　　　　　　　　Page 1 of 2
DATED : February 14, 1995
INVENTOR(S) : Yasushi ISHIMARU It is certified that error appears in the above-indentified patent and that said Letters Patent is hereby corrected as shown below:

Column 1 line 21,    "like" should be --like,--;
    line 46,    "wafer" should be --wafer,--;
    line 50,    delete [10];
    line 61,    "58," should be --58--.

Column 2 line 65,    "Thereafter" should be --Thereafter,--.

Column 3 line 23,    "plasma;" should be --plasma.--;
    line 36,    ":" should be --;--;
    line 39,    "frequency.A" should be --frequency--;
    line 40,    "port," should be --port.A--;
    line 61,    "said" should be --the--.

UNITED STATES PATENT AND TRADEMARK OFFICE
CERTIFICATE OF CORRECTION

PATENT NO. : 5,389,197
DATED : February 14, 1995
INVENTOR(S) : Yasushi ISHIMARU

It is certified that error appears in the above-indentified patent and that said Letters Patent is hereby corrected as shown below:

<u>Column 4</u> line 5,    "," should be --.--;
    line 6,    "indicated" should be --indicates--;
    line 34,   "example" should be --example,--.

<u>Column 5</u> line 54,   "gap" should be --gap,--.

<u>Column 6</u> line 4,    "(2.45 GHz)" should be --(2.45 GHz),--;
    line 6,    "22" should be --22,--.

Signed and Sealed this

Sixth Day of June, 1995

Attest:

BRUCE LEHMAN

Attesting Officer    Commissioner of Patents and Trademarks